(12) United States Patent
Osaki (10) Patent No.: US 10,394,121 B2
(45) Date of Patent: Aug. 27, 2019

(54) PATTERN-FORMING METHOD AND COMPOSITION

(71) Applicant: JSR Corporation, Minato-ku (JP)

(72) Inventor: Hitoshi Osaki, Tokyo (JP)

(73) Assignee: JSR CORPORATION, Minato-ku (JP)

( * ) Notice: Subject to any disclaimer, the term of this patent is extended or adjusted under 35 U.S.C. 154(b) by 0 days.

(21) Appl. No.: 16/199,767

(22) Filed: Nov. 26, 2018

(65) Prior Publication Data

US 2019/0107777 A1     Apr. 11, 2019

Related U.S. Application Data

(62) Division of application No. 15/170,108, filed on Jun. 1, 2016, now Pat. No. 10,175,575.

(51) Int. Cl.

| | |
|---|---|
| *G03F 7/00* | (2006.01) |
| *H01L 21/311* | (2006.01) |
| *G03F 7/40* | (2006.01) |
| *G03F 7/038* | (2006.01) |
| *C09D 133/06* | (2006.01) |
| *H01L 21/3213* | (2006.01) |
| *H01L 21/308* | (2006.01) |
| *C08L 25/04* | (2006.01) |
| *H01L 21/027* | (2006.01) |
| *G03F 7/039* | (2006.01) |
| *C09D 133/04* | (2006.01) |
| *C08L 25/16* | (2006.01) |

(52) U.S. Cl.
CPC ......... *G03F 7/0035* (2013.01); *C09D 133/04* (2013.01); *C09D 133/062* (2013.01); *G03F 7/038* (2013.01); *G03F 7/0397* (2013.01); *G03F 7/40* (2013.01); *G03F 7/405* (2013.01); *H01L 21/0271* (2013.01); *H01L 21/0273* (2013.01); *H01L 21/3086* (2013.01); *H01L 21/31144* (2013.01); *H01L 21/32139* (2013.01)

(58) Field of Classification Search
USPC .......................................... 525/241; 524/515
See application file for complete search history.

(56) References Cited

U.S. PATENT DOCUMENTS

| | | | | |
|---|---|---|---|---|
| 6,319,853 | B1 | 11/2001 | Ishibashi | |
| 7,868,053 | B2 * | 1/2011 | Hahn | C08J 9/16 |
| | | | | 521/139 |
| 2008/0167427 | A1 * | 7/2008 | Lin | C08F 8/20 |
| | | | | 525/209 |
| 2012/0053255 | A1 * | 3/2012 | Koerner | C08J 9/0019 |
| | | | | 521/59 |

FOREIGN PATENT DOCUMENTS

| | | |
|---|---|---|
| JP | 2008-300740 A | 12/2008 |
| JP | 2014-078540 A | 5/2014 |
| JP | 2015-149473 A | 8/2015 |

OTHER PUBLICATIONS

Office Action dated Dec. 12, 2017 in Taiwan Patent Application No. 106118049 (w/ English translation).

* cited by examiner

*Primary Examiner* — Fred M Teskin (74) *Attorney, Agent, or Firm* — Oblon, McClelland, Maier & Neustadt, L.L.P.

(57) ABSTRACT

A composition includes two types of polymers each having a different weight average molecular weight. The two types of polymers are each a styrene polymer having a group which bonds to at least one end of a main chain and which includes at least one of a hydroxy group, a carboxy group, a sulfanyl group, an epoxy group, a cyano group, a vinyl group or a carbonyl group. A difference in weight average molecular weight between the two types of polymers is no less than 2,000 and no greater than 30,000.

14 Claims, 4 Drawing Sheets

PATTERN-FORMING METHOD AND COMPOSITION

CROSS-REFERENCE TO RELATED APPLICATIONS

The present application is a divisional application of U.S. patent application Ser. No. 15/170,108, filed Jun. 1, 2016, the contents of which are incorporated herein by reference in their entirety.

BACKGROUND OF THE INVENTION

Field of Invention

The present invention relates to a pattern-forming method and a composition.

Description of the Related Art

In these days, microfabrication of various types of electronic device structures such as semiconductor devices and liquid crystal devices has been accompanied by demands for miniaturization of patterns in lithography processes. To meet such demands, methods have been proposed in which a side wall film is formed on a side wall of each opening in a base pattern formed on a substrate to thereby obtain a resist pattern in which the each opening has a smaller diameter, and the substrate is etched by using the resist pattern to obtain a substrate pattern (see Japanese Unexamined Patent Application, Publication Nos. 2008-300740 and 2015-149473).

However, the conventional methods have disadvantages: that it may be difficult to permit a uniform shrinkage of the opening on the base pattern regardless of directions, particularly in the case of the base pattern having an anisotropic shape such as an elliptic shape in a planar view and that even in the case of the base pattern having an isotropic shape such as a circular shape in a planar view, it may also be difficult to uniformly shrink and to obtain a resist pattern having little directional variance in pattern diameter and a small CDU (Critical Dimension Uniformity). According to the conventional method, it may therefore be difficult to obtain a substrate pattern in a desired shape.

PRIOR ART DOCUMENTS

Patent Documents

Patent Document 1: Japanese Unexamined Patent Application, Publication No. 2008-300740
Patent Document 2: Japanese Unexamined Patent Application, Publication No. 2015-149473

SUMMARY OF THE INVENTION

Problems to be Solved by the Invention

The present invention was made in view of the foregoing circumstances, and an objective thereof is to provide a pattern-forming method and a composition that can form a resist pattern by shrinking superior in directional uniformity of a dimension reduction amount, and that can provide, by using such a superior resist pattern as a mask, a pattern having a desired shape.

Means for Solving the Problems

According to an aspect of the invention made for solving the aforementioned problems, a pattern-forming method (hereinafter, may be also referred to as "pattern-forming method (I)") includes the steps of: forming a base pattern on a front face side of a substrate directly or via other layer (hereinafter, may be also referred to as "base pattern-forming step"); applying a composition (hereinafter, may be also referred to as "composition (I)") on at least a lateral face of the base pattern, the composition comprising one or a plurality of polymers (hereinafter, may be also referred to as "(A) polymer" or "polymer (A)") that is/are capable of interacting with a first polymer (hereinafter, may be also referred to as "(P) polymer" or "polymer (P)") constituting the base pattern; heating the composition (I) after the applying (hereinafter, may be also referred to as "heating step"); removing a portion of the polymer(s) (A) not having interacted with the polymer (P) (hereinafter, may be also referred to as "removing step"); and etching the substrate by using directly or indirectly a resist pattern comprising the base pattern and a coating film obtained after the removing step overlaid on the lateral face thereof (hereinafter, may be also referred to as "etching step"), in which the base pattern in a planar view had a shape with a long axis and a short axis, and a ratio of the lengths of the long axis to the short axis (hereinafter, may be also referred to as "long axis/short axis ratio") is no less than 1.5 and no greater than 10.

According to another aspect of the invention made for solving the aforementioned problems, a pattern-forming method (hereinafter, may be also referred to as "pattern-forming method (II)") includes the steps of: forming a base pattern on a front face side of a substrate directly or via other layer (base pattern-forming step); applying a composition (hereinafter, may be also referred to as "composition (I')") on at least a lateral face of the base pattern, the composition comprising one or a plurality of polymers (hereinafter, may be also referred to as "polymers (A')") that is/are capable of interacting with the polymer (P) constituting the base pattern (application step); heating the composition (I') after the application step (heating step); removing a portion of the polymers (A') not having interacted with the polymer (P) (removing step); and etching the substrate by using directly or indirectly a resist pattern comprising the base pattern and a coating film obtained after the removing step overlaid on the lateral face thereof (etching step), in which weight average molecular weights of the polymers (A') are different from each other.

According to yet another aspect of the invention made for solving the aforementioned problems, a composition includes two types of polymers of which weight average molecular weights are different from each other, in which the two types of polymers are a styrene polymer having a group that bonds to at least one end of a main chain and comprises at least one of: a hydroxy group; a carboxy group; a sulfanyl group; an epoxy group; a cyano group; a vinyl group; and a carbonyl group, and a difference in weight average molecular weight between the two types of polymers is no less than 2,000 and no greater than 30,000, the weight average molecular weight of one of the two types of polymers is no less than 5,000 and no greater than 25,000, and the weight average molecular weight of another polymer is greater than 25,000 and no greater than 50,000.

As used herein, being "capable of interacting" means that, for example, polymers can form a chemical bond therebetween. The "chemical bond" is a notion encompassing a covalent bond, an ionic bond, a metallic bond, and a coordinate bond, as well as the electrostatic attractive force between molecules and a hydrogen bond. A "long axis" in a base pattern as referred to means the longest one among the line segments connecting arbitrary two points on an outer periphery of one recessed part in the base pattern. A "short axis" as referred to means the longest one among the line segments connecting arbitrary two points on the outer periphery, being orthogonal to the long axis.

Effects of the Invention

According to the pattern-forming method and the composition of the present invention, a resist pattern can be formed by shrinking superior in directional uniformity of a dimension reduction amount, and by using such a superior resist pattern as a mask, a pattern having a desired shape can be obtained. Therefore, the pattern-forming method can be suitably used for working processes of semiconductor devices, and the like, in which microfabrication is expected to be further in progress hereafter.

DESCRIPTION OF THE EMBODIMENTS

Embodiments of the pattern-forming method according to the present invention will be described in detail hereinafter. The pattern-forming method includes the following pattern-forming method (I) and pattern-forming method (II).
Pattern-Forming Method (I)

The pattern-forming method (I) includes the base pattern-forming step, the application step, the heating step, the removing step, and the etching step. In the pattern-forming method (I), the base pattern in a planar view has a shape with a long axis and a short axis, and the long axis/short axis ratio is no less than 1.5 and no greater than 10.

The pattern-forming method (I), including the above described steps and employing the composition (I) containing the particular polymer (A) as a composition to be applied in the application step, allows shrinking superior in directional uniformity of a dimension reduction amount in the case of the base pattern having the particular shape, and can provide a resist pattern with a dimension reduction amount ratio close to 1. In addition, by using such a superior resist pattern as a mask, a pattern having a desired shape can be obtained.
Pattern-Forming Method (II)

The pattern-forming method (II) includes the base pattern-forming step, the application step, the heating step, the removing step, and the etching step. In the pattern-forming method (II), the composition (I') to be applied in the application step includes a plurality of polymers (polymers (A')) having weight average molecular weights that are different from each other.

Figure 1:
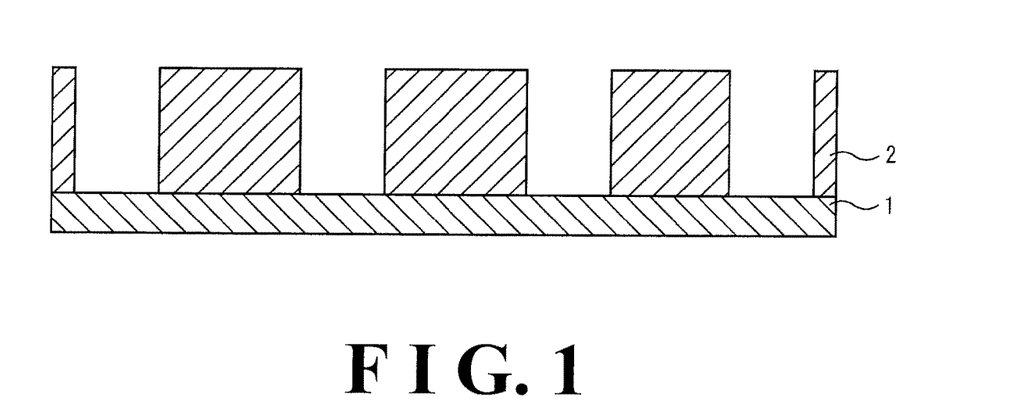
FIG. 1 shows a schematic cross sectional view illustrating one example of the state after forming a base pattern on the front face side of a substrate.

The pattern-forming method (I), including the above described steps and employing a composition containing a mixture of the plurality of polymers of which weight average molecular weights are different from each other as the composition (I') to be applied in the application step, allows shrinking superior in directional uniformity of a dimension reduction amount in the case of the base pattern having the particular shape, and can provide a resist pattern with a small CDU in the case of the base pattern having an isotropic shape in a planar view and can provide a resist pattern with a dimension reduction amount ratio close to 1 in the case of the base pattern having an anisotropic shape in a planar view. In addition, by using such a superior resist pattern as a mask, a pattern having a desired shape can be formed. Hereinafter, each step will be described with reference to drawings.
Base Pattern-Forming Step In this step, a base pattern is formed on the front face side of a substrate directly or via other layer. The base pattern 2 may be directly formed on one face of a substrate 1 as shown in FIG. 1, or may be formed via other layer by, for example, forming an underlayer film, a spin-on glass (SOG) film and/or a resist film on the upper face (one face side) of the substrate, and then forming the base pattern 2 on the upper face side (a face side not facing the substrate 1) of these films on the substrate 1. Of these procedures, in light of possible formation of the pattern in a more convenient manner on the substrate by etching using as a mask the resist pattern formed, it is preferred that the base pattern is directly formed on one face side of the substrate.

The base pattern 2 includes a polymer (hereinafter, may be also referred to as "polymer (P)") that is capable of interacting with the polymer (A) contained in the composition (I) described later. As the polymer (P), for example, polymers and the like having a group that is capable of interacting with the polymer (A) may be exemplified. As the group that is capable of interacting with the polymer (A), for example, a hydroxy group, a carboxy group, a carbonyl group, and the like may be exemplified. In the case of the base pattern 2 being formed by etching as described later, a hydroxy group, a carboxy group, a carbonyl group and the like may be generally contained in the constituent polymer.

The polymer (P) is not particularly limited as long as the polymer can interact with the polymer (A), and in light of an improvement of etching resistance, preferably includes as a principal component a polymer having an aromatic ring (hereinafter, may be also referred to as "polymer (P1)"). The "principal component" as referred to means a component whose proportion is the largest, preferably no less than 50% by mass and more preferably no less than 70%.

As the polymer (P1), for example, a novolak polymer, a resol polymer, a styrene polymer, an acenaphthylene polymer, a calixarene polymer, a pyrene polymer and the like may be exemplified.

The lower limit of the proportion of the aromatic ring in the polymer (P1) is preferably 50% by mass, more preferably 60% by mass, and still more preferably 70% by mass. The upper limit of the proportion is preferably 99% by mass, and more preferably 95% by mass.
Procedure of Base Pattern Formation According to an exemplary procedure of directly forming the base pattern 2 on one face of the substrate 1, for example, after directly forming the underlayer film on one face of the substrate 1, a hole pattern is formed on the underlayer film. In this procedure, more specifically, the underlayer film is formed on the upper face side of the substrate 1 by using a composition for underlayer film formation. Next, as needed, an SOG film may be formed on the face side not facing the substrate 1 of the underlayer film on the substrate 1 by using an SOG composition. The resist film is formed on the upper face of the underlayer film or the SOG film on the substrate 1 by using a resist composition. Then, this resist film is exposed and developed, whereby a resist film pattern is formed. By using this resist film pattern as a mask, the SOG film and/or the underlayer film are/is sequentially etched. The etching procedure may involve dry etching in which a gas mixture of $CF_4/O_2$/Air, $N_2/O_2$, etc., is used; wet etching in which an aqueous hydrofluoric acid solution, etc., is used; or the like. Of these, in light of more favorable transfer of the shape to be executed and possibility of formation of a greater number of groups that are capable of interacting with the polymer (A) in the polymer constituting the base pattern, the dry etching is preferred. When the underlayer film and the SOG film are sequentially dry-etched, it is preferred that the SOG film remaining on the surface of the resulting underlayer film pattern is detached away by using an aqueous hydrofluoric acid solution or the like. Accordingly, the base pattern 2 directly formed on one face of the substrate is obtained.

As the substrate 1, for example, a silicon substrate such as a silicon (Bare-Si) wafer, and a conventional well-known substrate such as an aluminum-coated wafer may be used. Of these, the silicon substrate is preferred and the silicon wafer is more preferred.

As the composition for underlayer film formation, a conventionally well-known organic underlayer film-forming material or the like may be used, and for example, a composition for underlayer film formation containing a crosslinking agent and the like may be exemplified.

The forming procedure of the underlayer film is not particularly limited, and, for example, a process in which after applying a composition for underlayer film formation on one face of the substrate with by a well-known procedure such as spin-coating, followed by prebaking (PB), the resultant coating film is hardened by carrying out irradiation with a radioactive ray and/or heating, and the like may be exemplified. Examples of the radioactive ray for use in irradiation include: electromagnetic waves such as a visible light ray, an ultraviolet ray, a far ultraviolet ray, an X-ray and a γ-ray; particle rays such as electron beam, a molecular beam and an ion beam; and the like. The lower limit of the temperature of the heating is preferably 90° C., more preferably 120° C., and still more preferably 150° C. The upper limit of the temperature of the heating is preferably 550° C. and more preferably 450° C., and a temperature of no higher than 300° C. is even more preferred. The lower limit of the heating time period is preferably 5 sec, more preferably 10 sec, and still more preferably 20 sec. The upper limit of the heating time period is preferably 1,200 sec, more preferably 600 sec, and still more preferably 300 sec. The lower limit of the average thickness of the underlayer film is preferably 10 nm, more preferably 30 nm, and still more preferably 50 nm. The upper limit of the average thickness is preferably 1,000 nm, more preferably 500 nm, and still more preferably 200 nm.

As the SOG composition, a conventionally well-known SOG composition or the like may be used, and for example, a composition containing an organic polysiloxane, and the like may be exemplified.

The forming procedure of the SOG film is not particularly limited, and examples thereof include a process in which after applying an SOG composition onto one face of the substrate or the face of the underlayer film not facing the substrate 1 by a well-known procedure such as spin-coating, followed by PB, and the resultant coating film is hardened by carrying out irradiation with a radioactive ray and/or heating. Examples of the radioactive ray for use in irradiation include: electromagnetic waves such as a visible light ray, an ultraviolet ray, a far ultraviolet ray, an X-ray and a γ-ray; particle rays such as an electron beam, a molecular beam and an ion beam; and the like. The lower limit of the temperature of the heating is preferably 100° C., more preferably 150° C., and still more preferably 180° C. The upper limit of the temperature of the heating is preferably 450° C., more preferably 400° C., and still more preferably 350° C. The lower limit of the heating time period is preferably 5 sec, more preferably 10 sec, and still more preferably 20 sec. The upper limit of the heating time period is preferably 1,200 sec, more preferably 600 sec, and still more preferably 300 sec. The lower limit of the Average thickness of the SOG film is preferably 10 nm, more preferably 15 nm, and still more preferably 20 nm. The upper limit of the average thickness is preferably 1,000 nm, more preferably 500 nm, and still more preferably 100 nm.

As the resist composition, a conventional resist composition such as, for example, a composition containing a polymer having an acid-labile group, a radiation-sensitive acid generator and a solvent, or the like may be used.

In the procedure of resist film pattern formation, the resist composition is applied onto: one face of the substrate 1; a face of the underlayer film not facing the substrate 1; or a face of the SOG film not facing the substrate 1, and thereafter PB is carried out, whereby a resist film is formed. Next, an exposure is carried out through a mask pattern for forming the base pattern 2 having a desired shape. Examples of the radioactive ray which may be used for the exposure include electromagnetic waves such as an ultraviolet ray, a far ultraviolet ray, an extreme ultraviolet ray (EUV), and an X-ray; charged particle rays such as an electron beam and a α-ray, and the like. Of these, the far ultraviolet ray is preferred, an ArF excimer laser beam and a KrF excimer laser beam are more preferred, and an ArF excimer laser beam is still more preferred. For the exposure, liquid immersion lithography may be employed. After the exposure, it is preferred that post exposure baking (PEB) is carried out. Then, a development is carried out by using a developer solution, e.g., an alkaline developer solution such as a 2.38% by mass aqueous tetramethylammonium hydroxide solution or an aqueous tetrabutylammonium hydroxide solution, an organic solvent such as butyl acetate or anisole.

The lower limit of the average thickness of the resist film is preferably 10 nm, more preferably 30 nm, and still more preferably 50 nm. The upper limit of the average thickness is preferably 1,000 nm, more preferably 500 nm, and still more preferably 200 nm.

The shape of the base pattern 2 may be appropriately selected depending on the shape of the formed pattern that the substrate will finally have, and is exemplified by, in a planar view: circular (true circular); elliptic (oval); regular tetragonal; rectangular; hook-shaped; trapezoidal; triangular; and the like.

In the case of the base pattern 2 to be formed being circular, the lower limit of the average diameter thereof is preferably 10 nm, more preferably 20 nm, still more preferably 30 nm, and particularly preferably 40 nm. The upper limit of the average diameter is preferably 200 nm, more preferably 100 nm, still more preferably 90 nm, and particularly preferably 80 nm.

The lower limit of the pitch of the base pattern 2 formed is preferably 30 nm, more preferably 50 nm, even more preferably 70 nm, and particularly preferably 90 nm. The upper limit of the pitch is preferably 1,000 nm, more preferably 500 nm, even more preferably 200 nm, and particularly preferably 150 nm.

The lower limit of the ratio of the pitch to the average diameter of the base pattern 2 is preferably 0.5, more preferably 1, even more preferably 1.5, and particularly preferably 1.8. The upper limit of the ratio is preferably 10, more preferably 7, even more preferably 4, and particularly preferably 3.

Thus obtained base pattern 2 can be subjected to a treatment of, for example, irradiating with an ultraviolet ray of 254 nm, etc., followed by heating at 100° C. or higher and 200° C. or lower for a time period of no less than 1 min and no greater than 30 min so as to promote hardening.

In addition, the face of the base pattern 2 may be subjected to a hydrophobilization treatment or a hydrophilization treatment. A specific treatment procedure may be exemplified by e.g., a hydrogenation treatment including an exposure to hydrogen plasma for a certain period of time. By increasing the hydrophobicity or hydrophilicity of the face of the base pattern 2, coating properties of the composition (I) in the applying step can be further improved.

In the pattern-forming method (I), the base pattern 2 in a planar view has a shape with a long axis and a short axis, with the long axis/short axis ratio being no less than 1.5 and no greater than 10. "In a planar view" as referred to means a view from a vertical direction with respect to the substrate 1.

As the shape with a long axis and a short axis in the base pattern 2, an anisotropic shape such as an elliptic shape and a rectangular shape may be exemplified. Of these, in light of possibility of a further improvement of the directional uniformity of a dimension reduction amount in the pattern formation, the elliptic shape is preferred.

The lower limit of the long axis/short axis ratio is preferably 2, more preferably 2.5, still more preferably 3, and particularly preferably 3.5. The upper limit of the long axis/short axis ratio is preferably 9.5, more preferably 9, still more preferably 8.5, and particularly preferably 8.

It is particularly preferable to employ the pattern-forming method (II), since even in the case of the base pattern 2 having a shape, in a planar view, with a long axis and a short axis, a sufficient dimension reduction amount can be obtained and the directional uniformity of the dimension reduction amount is superior.

Application Step

Figure 2:
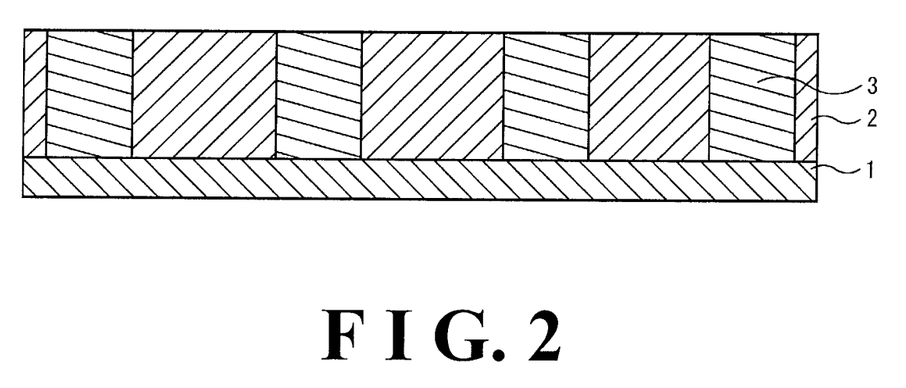
FIG. 2 shows a schematic cross sectional view illustrating one example of the state after applying the composition (I) on at least the lateral face of the base pattern shown in FIG. 1.

In this step, the composition (I) is applied on at least the lateral face of the base pattern 2 as illustrated in FIG. 2.

The applying procedure of the composition (I) is exemplified by spin-coating and the like.

Composition (I)

The composition (I) contains the polymer (A) that is capable of interacting with the polymer (P) constituting the base pattern 2. The composition (I) generally contains, in addition to the polymer (A), a solvent (B). The composition (I) may contain other component in addition to the polymer (A) and the solvent (B).

(A) Polymer

The polymer (A) is one or a plurality of polymers that is/are capable of interacting with the polymer (P) constituting the base pattern 2. The polymer (A) generally has a group that can interact with the polymer (P) (hereinafter, may be also referred to as "group (I)"). The interaction between the polymer (A) and the polymer (P) is, in light of further facilitation of overlaying of the polymer (A) onto a lateral face of the base pattern 2: preferably formation of a chemical bond; more preferably formation of a covalent bond, formation of an ionic bond, an electrostatic attractive force between molecules, or formation of a hydrogen bond; still more preferably formation of a covalent bond, or formation of a hydrogen bond; and particularly preferably formation of a covalent bond.

In the case of the polymer (P) having a hydroxy group and/or a carboxy group, the group (I) that is capable of forming a chemical bond with the polymer (P) is exemplified by a group that includes a hydroxy group, a carboxy group, a sulfanyl group, an epoxy group, a cyano group, a vinyl group and/or a carbonyl group, and the like. Of these, since it is considered to form a covalent bond with a hydroxy group and/or a carboxy group in the polymer (P) under heat, and in light of possibility of a strong interaction, the group (I) is preferably a group that includes a hydroxy group, or a group that includes a carbonyl group, and more preferably a group that includes a hydroxy group.

In the polymer (A), the group (I) may bond to an end of either the main chain, or ends of both the side chain and the main chain. The "main chain" as referred to means the longest one of the atom chains of a polymer. The "side chain" as referred to means an atom chain of a polymer other than the main chain. Of these, in light of enhancing the interaction with the polymer (P), the group (I) preferably bonds to an end of the main chain.

Examples of the group (I) that bonds to an end of the main chain of the polymer (A) include groups represented by the following formulae.

Of these, a group having a hydroxy group is preferred, and a hydroxyethyl group and a hydroxypropyl group are more preferred.

Examples of the polymer (A) include a styrene polymer, a (meth)acrylic polymer, an ethylene polymer, a copolymer composed of a combination thereof, and the like.

The styrene polymer includes a structural unit derived from substituted or unsubstituted styrene.

Examples of the substituted styrene include α-methylstyrene, o-, m-, p-methylstyrene, p-t-butylstyrene, 2,4,6-trimethyl styrene, p-methoxystyrene, p-t-butoxystyrene, o-, m-, p-vinylstyrene, o-, m-, p-hydroxystyrene, m-, p-chloromethylstyrene, p-chlorostyrene, p-bromostyrene, p-iodostyrene, p-nitrostyrene, p-cyano styrene, and the like.

The (meth)acrylic polymer includes a structural unit derived from (meth)acrylic acid or a (meth)acrylic acid ester.

Examples of the (meth)acrylic acid ester include:

(meth)acrylic acid alkyl esters such as methyl (meth)acrylate, ethyl (meth)acrylate, t-butyl (meth)acrylate and 2-ethylhexyl (meth)acrylate;

(meth)acrylic acid cycloalkyl esters such as cyclopentyl (meth)acrylate, cyclohexyl (meth)acrylate, 1-methylcyclopentyl (meth)acrylate, 2-ethyladamantyl (meth)acrylate and 2-(adamantan-1-yl)propyl (meth)acrylate;

(meth)acrylic acid aryl esters such as phenyl (meth)acrylate and naphthyl (meth)acrylate;

(meth)acrylic acid-substituted alkyl esters such as 2-hydroxyethyl (meth)acrylate, 3-hydroxyadamantyl (meth)acrylate, 3-glycidylpropyl (meth)acrylate and 3-trimethylsilylpropyl (meth)acrylate; and the like.

The ethylene polymer includes a structural unit derived from substituted or unsubstituted ethylene.

Examples of the substituted ethylene include:

alkenes such as propene, butene and pentene;

vinylcycloalkanes such as vinylcyclopentane and vinylcyclohexane;

cycloalkenes such as cyclopentene and cyclohexene;

4-hydroxy-1-butene; vinylglycidyl ether; vinyltrimethylsilyl ether; and the like.

In a case where the polymer (P) constituting the base pattern 2 contains an aromatic ring, in light of increasing an interaction between the polymer (P) and the polymer (A), the polymer (A) is preferably a styrene polymer, more preferably a styrene polymer having the group (I) that bonds to at least one end of the main chain, still more preferably a styrene polymer having a group that bonds to at least one end of the main chain and includes at least one of: a hydroxy group; a carboxy group; a sulfanyl group; an epoxy group; a cyano group; a vinyl group; and a carbonyl group, and particularly preferably a polymer of unsubstituted styrene having a group that bonds to at least one end of the main chain and includes at least one of: a hydroxy group; a carboxy group; a sulfanyl group; an epoxy group; a cyano group; a vinyl group; and a carbonyl group.

The lower limit of the weight average molecular weight (Mw) of the polymer (A) is preferably 1,000, more preferably 3,000, even more preferably 5,000, and particularly preferably 7,000. The upper limit of the Mw is preferably 100,000, more preferably 70,000, even more preferably 50,000, and particularly preferably 40,000.

The upper limit of the ratio (dispersity index) of the Mw to the number average molecular weight (Mn) of the polymer (A) is preferably 5, more preferably 3, even more preferably 2, and particularly preferably 1.3. The lower limit of the ratio is preferably 1, and more preferably 1.05.

The lower limit of the content of the polymer (A) in the composition (I) with respect to the total solid content is preferably 80% by mass, more preferably 90% by mass, and still more preferably 95% by mass. The upper limit of the content is, for example, 100% by mass. The "total solid content" as referred to means the sum of the components other than the solvent (B).

(B) Solvent

The solvent (B) is not particularly limited as long as it is a solvent capable of dissolving or dispersing at least the polymer (A) and other component(s).

Examples of the solvent (B) include an alcohol solvent, an ether solvent, a ketone solvent, an amide solvent, an ester solvent, and a hydrocarbon solvent.

Examples of the alcohol solvent include:

monohydric alcohol solvents such as methanol, ethanol, n-propanol, iso-propanol, n-butanol, iso-butanol, sec-butanol, tert-butanol, n-pentanol, iso-pentanol, 2-methylbutanol, sec-pentanol, tert-pentanol, 3-methoxybutanol, n-hexanol, 2-methylpentanol, sec-hexanol, 2-ethylbutanol, sec-heptanol, 3-heptanol, n-octanol, 2-ethylhexanol, sec-octanol, n-nonyl alcohol, 2,6-dimethyl-4-heptanol, n-decanol, sec-undecyl alcohol, trimethylnonyl alcohol, sec-tetradecyl alcohol, sec-heptadecyl alcohol, furfuryl alcohol, phenol, cyclohexanol, methylcyclohexanol, 3,3,5-trimethylcyclohexanol, benzyl alcohol and diacetone alcohol;

polyhydric alcohol solvents such as ethylene glycol, 1,2-propylene glycol, 1,3-butylene glycol, 2,4-pentanediol, 2-methyl-2,4-pentanediol, 2,5-hexanediol, 2,4-heptanediol, 2-ethyl-1,3-hexanediol, diethylene glycol, dipropylene glycol, triethylene glycol and tripropylene glycol;

polyhydric alcohol partially etherified solvents such as ethylene glycol monomethyl ether, ethylene glycol monoethyl ether, ethylene glycol monopropyl ether, ethylene glycol monobutyl ether, ethylene glycol monohexyl ether, ethylene glycol monophenyl ether, ethylene glycol mono-2-ethylbutyl ether, diethylene glycol monomethyl ether, diethylene glycol monoethyl ether, diethylene glycol monopropyl ether, diethylene glycol monobutyl ether, diethylene glycol monohexyl ether, propylene glycol monomethyl ether, propylene glycol monoethyl ether, propylene glycol monopropyl ether, propylene glycol monobutyl ether, dipropylene glycol monomethyl ether, dipropylene glycol monoethyl ether and dipropylene glycol monopropyl ether; and the like.

Examples of the ether solvent include:

dialkyl ether solvents such as diethyl ether, dipropyl ether and dibutyl ether;

cyclic ether solvents such as tetrahydrofuran and tetrahydropyran;

aromatic ring-containing ether solvents such as diphenyl ether and anisole; and the like.

Examples of the ketone solvent include:

chain ketone solvents such as acetone, methyl ethyl ketone, methyl n-propyl ketone, methyl n-butyl ketone, diethyl ketone, methyl iso-butyl ketone, 2-heptanone, ethyl n-butyl ketone, methyl n-hexyl ketone, di-iso-butyl ketone and trimethylnonanone;

cyclic ketone solvents such as cyclopentanone, cyclohexanone, cycloheptanone, cyclooctanone and methylcyclohexanone;

2,4-pentanedione, acetonylacetone, and acetophenone; and the like.

Examples of the amide solvent include:

cyclic amide solvents such as N,N'-dimethylimidazolidinone and N-methylpyrrolidone;

chain amide solvents such as N-methylformamide, N,N-dimethylformamide, N,N-diethylformamide, acetamide, N-methylacetamide, N,N-dimethylacetamide and N-methylpropionamide; and the like.

Examples of the ester solvent include:

acetic acid ester solvents such as methyl acetate, ethyl acetate, n-propyl acetate, iso-propyl acetate, n-butyl acetate, iso-butyl acetate, sec-butyl acetate, n-pentyl acetate, i-pentyl acetate, sec-pentyl acetate, 3-methoxybutyl acetate, methylpentyl acetate, 2-ethylbutyl acetate, 2-ethylhexyl acetate, benzyl acetate, cyclohexyl acetate, methylcyclohexyl acetate and n-nonyl acetate;

polyhydric alcohol partially etherified carboxylate solvents such as ethylene glycol monomethyl ether acetate, ethylene glycol monoethyl ether acetate, diethylene glycol monomethyl ether acetate, diethylene glycol monoethyl ether acetate, diethylene glycol mono-n-butyl ether acetate, propylene glycol monomethyl ether acetate, propylene glycol monomethyl ether propionate, propylene glycol monoethyl ether acetate, propylene glycol monopropyl ether acetate, propylene glycol monobutyl ether acetate, dipropylene glycol monomethyl ether acetate and dipropylene glycol monoethyl ether acetate;

lactone solvents such as γ-butyrolactone and valerolactone;

carbonate solvents such as dimethyl carbonate, diethyl carbonate, ethylene carbonate and propylene carbonate;

glycol diacetate, methoxytriglycol acetate, ethyl propionate, n-butyl propionate, iso-amyl propionate, diethyl oxalate, di-n-butyl oxalate, methyl acetoacetate, ethyl acetoacetate, methyl lactate, ethyl lactate, n-butyl lactate, n-amyl lactate, diethyl malonate, dimethyl phthalate, and diethyl phthalate; and the like.

Examples of the hydrocarbon solvent include:

aliphatic hydrocarbon solvents such as n-pentane, iso-pentane, n-hexane, iso-hexane, n-heptane, iso-heptane, 2,2,4-trimethylpentane, n-octane, iso-octane, cyclohexane and methylcyclohexane; and aromatic hydrocarbon solvents such as benzene, toluene, xylene, mesitylene, ethylbenzene, trimethylbenzene, methylethylbenzene, n-propylbenzene, iso-propylbenzene, diethylbenzene, iso-butylbenzene, triethylbenzene, di-iso-propylbenzene and n-amylnaphthalene; and the like.

Of these, the ester solvent is preferred, the polyhydric alcohol partially etherified carboxylate solvent is more preferred, and propylene glycol monomethyl ether acetate is still more preferred. The composition (I) may contain one type of the solvent (B), or two or more types thereof.

Other Component

The composition (I) may also contain other component(s) in addition to the polymer (A) and the solvent (B). The other component(s) is/are exemplified by a surfactant and the like. When the composition (I) contains the surfactant, the application property onto the base pattern 2 may be improved.

Preparation Method of Composition (I)

The composition (I) may be prepared by, for example, mixing the polymer (A), the solvent (B), and as needed the other component(s) at a predetermined ratio, and preferably filtering the resulting mixture through a membrane filter having a polar size of about 200 nm, etc. The lower limit of the solid content concentration of the composition (I) is preferably 0.1% by mass, more preferably 0.5% by mass, and still more preferably 0.7% by mass. The upper limit of the solid content concentration is preferably 30% by mass, more preferably 10% by mass, and still more preferably 3% by mass.

Composition (I')

In the pattern-forming method (II), the composition (I') is applied as the composition (I) in the application step. The composition (I') contains a plurality of polymers (polymer (A')) as the polymer (A), the plurality of polymers each having different weight average molecular weight (Mw).

The polymer (A') in the composition (I') is preferably two types of polymers having different Mw. Hereinafter, the two types of polymers are referred to as a third polymer (hereinafter, may be also referred to as "polymer (A1)") and a fourth polymer (hereinafter, may be also referred to as "polymer (A2)"). It is to be noted that Mw of the polymer (A2) is greater than Mw of the polymer (A1).

The Mw of the polymer (A1) is preferably no less than 5,000, more preferably no less than 8,000, and still more preferably no less than 10,000. The Mw is preferably no greater than 25,000, more preferably no greater than 23,000, and still more preferably no greater than 22,000.

The Mw of the polymer (A2) is preferably greater than 25,000, more preferably greater than 27,000, and still more preferably greater than 30,000. The Mw is preferably no greater than 50,000, more preferably no greater than 40,000, and still more preferably no greater than 37,000.

The lower limit of the difference between the Mw of the polymer (A2) and the Mw of the polymer (A1), that is the lower limit of a value obtained by subtracting the Mw of the polymer (A1) from the Mw of the polymer (A2), is preferably 2,000, more preferably 5,000, still more preferably 8,000, and particularly preferably 15,000. The upper limit of the abovementioned value is preferably 30,000, more preferably 25,000, and still more preferably 22,000.

The lower limit of a ratio of the Mw of the polymer (A2) to the Mw of the polymer (A1), that is the lower limit of a value obtained by dividing the Mw of the polymer (A2) by the Mw of the polymer (A1), is preferably 1.1, more preferably 1.4, still more preferably 1.8, and particularly preferably 2.5. The upper limit of the abovementioned value is preferably 5, more preferably 4, and still more preferably 3.5.

In the pattern-forming method (I), the composition (I') is preferred as the composition (I) to be applied in the application step.

Heating Step

Figure 3:
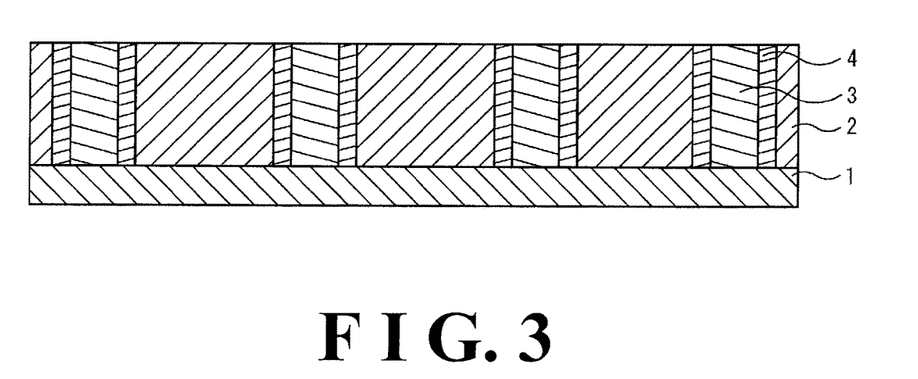
FIG. 3 shows a schematic cross sectional view illustrating one example of the state after heating the composition (I) of FIG. 2.

In this step, the composition (I) obtained after the application step is heated. This accelerates the interaction between the polymer (P) in the base pattern 2 and the polymer (A) in the composition (I) as illustrated in FIG. 3, thus overlaying, on a lateral face of the base pattern 2, a coating film (I) 4 containing the polymer (A) in a portion interacted with the polymer (P) is facilitated.

Examples of a heating means include an oven and a hot plate. The lower limit of the heating temperature is preferably 80° C., more preferably 100° C., and still more preferably 150° C. The upper limit of the heating temperature is preferably 400° C., more preferably 350° C., and still more preferably 300° C. The lower limit of the heating time is preferably 10 sec, more preferably 1 min, and still more preferably 10 min. The upper limit of the heating time is preferably 120 min, more preferably 60 min, and still more preferably 30 min.

Removing Step

Figure 4:
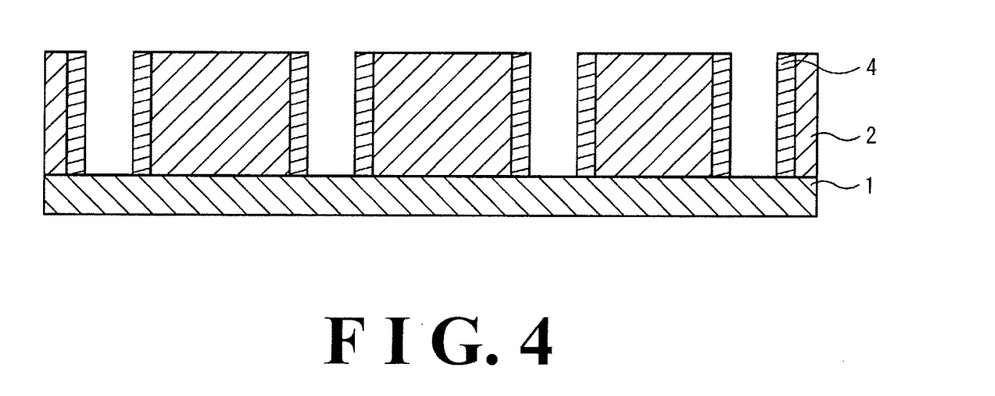
FIG. 4 shows a schematic cross sectional view illustrating one example of the state after removing a portion of the polymer (A) illustrated in FIG. 3 not having interacted with a polymer constituting the base pattern.

In this step, a portion of the polymer (A) not having interacted with the polymer (P) is removed. This removes the portion in the composition (I) 3 containing the polymer (A) not having interacted with the polymer (P) after the heating step, and forms a resist pattern composed of the base pattern 2 and the coating film (I) 4 as illustrated in FIG. 4.

Removal in the removing step is generally rinsing of the substrate 1, on which the coating film (I) 4 is formed, with a rinse agent. An organic solvent is generally used as the rinse agent, and for example, a polyhydric alcohol partially etherified carboxylate solvent such as propylene glycol monomethyl ether acetate is used.

An average thickness of the coating film (I) 4 being formed can be adjusted to a desired value by appropriately selecting conditions such as: a type and concentration of the polymer (A) in the composition (I); and the heating temperature and the heating time in the heating step according to a desired dimension reduction amount. The resist pattern-forming method can make the directional uniformity of the dimension reduction amount superior in the case of the base pattern 2 having an anisotropic shape. The lower limit of the average thickness of the coating film (I) 4 is preferably 1 nm, more preferably 3 nm, and still more preferably 5 nm. The upper limit of the average thickness is, for example, 20 nm.

Etching Step

In this step, the substrate is etched by directly or indirectly using the resist pattern composed of the base pattern 2 and the coating film (I) 4 obtained after the removing step overlaid on the lateral face thereof. This step forms a substrate pattern. The resist pattern-forming method, which uses the resist pattern obtained by shrinking superior in directional uniformity of a dimension reduction amount, can provide a substrate pattern having a desired shape.

In a case where the base pattern 2 is directly formed on a front face side of the substrate 1 in the base pattern-forming step, this etching generally uses the resist pattern directly, in other words, the etching is performed once to obtain the substrate pattern. In a case where the base pattern is formed on the front face side of the substrate 1 via another layer, this etching generally uses the resist pattern indirectly, i.e., the another layer is etched by using the resist pattern and then etching is successively performed by using the another layer thus etched as a mask, in other words, the etching is performed a plurality of times to obtain the substrate pattern.

Examples of the substrate pattern include a contact hole pattern.

The etching procedure is exemplified by well-known techniques including: reactive ion etching (RIE) such as chemical dry etching carried out using $CF_4$, an $O_2$ gas or the like by utilizing the difference in etching rate of each layer, etc., as well as chemical wet etching (wet development) carried out by using an etching liquid such as an organic solvent or hydrofluoric acid; physical etching such as sputtering etching and ion beam etching. Of these, the reactive ion etching is preferred, and the chemical dry etching and the chemical wet etching are more preferred.

Prior to the chemical dry etching, an irradiation with a radioactive ray may be also carried out as needed. As the radioactive ray, when the portion to be removed by etching is a polymer containing a methyl polymethacrylate block, a radioactive ray of 172 nm or the like may be used. The irradiation with such a radioactive ray results in degradation of the methyl polymethacrylate block, whereby the etching is facilitated.

Examples of the organic solvent for use in the chemical wet etching include:
  alkanes such as n-pentane, n-hexane and n-heptane;
  cycloalkanes such as cyclohexane, cycloheptane and cyclooctane;
  saturated carboxylic acid esters such as ethyl acetate, n-butyl acetate, i-butyl acetate and methyl propionate;
  ketones such as acetone, methyl ethyl ketone, methyl isobutyl ketone and methyl n-pentyl ketone;
  alcohols such as methanol, ethanol, 1-propanol, 2-propanol and 4-methyl-2-pentanol; and the like. These solvents may be used either alone, or two or more types thereof may be used in combination.

After completion of the patterning onto the substrate, the parts used as a mask are removed from the front face side of the substrate by a dissolving treatment or the like, whereby a substrate having the formed pattern can be finally obtained. The substrate obtained according to the pattern-forming method is suitably used for semiconductor elements and the like, and the semiconductor elements are widely used for LED, solar cells, and the like.

Composition

The composition contains two types of polymers having different weight average molecular weights, wherein:
  the two types of polymers are each a styrene polymer having a group that bonds to at least one end of a main chain, the group having at least one of a hydroxy group, a carboxy group, a sulfanil group, an epoxy group, a cyano group, a vinyl group, and a carbonyl group;
  a difference in weight average molecular weight between the two types of polymers is no less than 2,000 and no greater than 30,000; and
  the weight average molecular weight of one polymer among the two types of polymers is no less than 5,000 and no greater than 25,000, and the weight average molecular weight of another polymer is greater than 25,000 and no greater than 50,000.

The composition is described supposing a case where: the composition (I') used in the pattern-forming method (II) contains two types of polymers (the polymer (A1) and the polymer (A2)) each having different Mw as the polymer (A'); both of the polymer (A1) and the polymer (A2) are the styrene polymer having the abovementioned group that bonds to at least one end of a main chain; and the difference in Mw between the polymer (A1) and the polymer (A2), the Mw of the polymer (A1), and the Mw of the polymer (A2) fall within the above ranges.

EXAMPLES

Hereinafter, the present invention is explained in detail by way of Examples, but the present invention is not in any way limited to these Examples. Measuring methods for various types of physical properties are shown below.

Mw and Mn

The Mw and the Mn of the polymer were determined by gel permeation chromatography (GPC) using GPC columns (Tosoh Corporation; "G2000 HXL"×2, "G3000 HXL"×1 and "G4000 HXL"×1) under the following conditions:
  eluent: tetrahydrofuran (Wako Pure Chemical Industries, Ltd.);
  flow rate: 1.0 mL/min;
  sample concentration: 1.0% by mass;
  amount of sample injected: 100 µL;
  column temperature: 40° C.;
  detector: differential refractometer; and
  standard substance: mono-dispersed polystyrene.

$^{13}$C-NMR Analysis

$^{13}$C-NMR analysis was carried out using a nuclear magnetic resonance apparatus ("JNM-EX400" available from JEOL, Ltd.), with DMSO-$d_6$ for use as a solvent for measurement. The proportion of each structural unit in the polymer was calculated from an area ratio of a peak corresponding to each structural unit on the spectrum obtained by the $^{13}$C-NMR.

Synthesis of Polymer

Monomer compounds and a polymerization initiator used for synthesis of a polymer (a-1) in a composition used in Comparative Examples are shown below.

(M-1)

(M-2)

(Z-1)

Synthesis Example 1 (Synthesis of Polymer (a-1))

A monomer solution was prepared by dissolving 65 mol % of the compound (M-1), 35 mol % of the compound (M-2), and 2 mol % of the compound (Z-1) as a polymerization initiator in 60 g of methyl ethyl ketone. It is to be noted that mol % of each compound is a proportion with respect to a total molar number of all compounds, and mol % of the polymerization initiator is a proportion with respect to a total molar number of all compounds and the polymerization initiator. The total mass of the compound was adjusted to 30 g. Then, a 500 ml, three-neck flask equipped with a thermometer and a dropping funnel was charged with 30 g of methyl ethyl ketone, followed by nitrogen purge for 30 min and then heating to 80° C. while stirring inside the flask with a magnetic stirrer. Thereafter, the monomer solution thus prepared was added dropwise into the three-neck flask over 3 hrs by using the dropping funnel. A polymerization reaction was conducted for 6 hrs from the start of the dropwise addition that is considered as the start of the polymerization reaction. Following cooling of the polymerization reaction liquid to 30° C. or lower, the polymerization reaction liquid was added to 600 g of methanol and deposited white powder was filtered out. The white powder thus filtered out was washed twice each with 120 g of methanol by making it into a slurry, followed by filtering out and drying at 50° C. for 17 hrs to obtain white powder of the polymer (a-1) (yield: 82.3%). Mw of the polymer (a-1) was 14,000 and Mw/Mn was 2.33. In addition, the $^{13}$C-NMR analysis revealed that proportions of a structural unit derived from (M-1) and a structural unit derived from (M-2) in the polymer (a-1) were 63.9 mol % and 36.1 mol %, respectively.

Preparation of Composition (I)

The polymer (A), the solvent (B) and a basic compound that were used for preparation of the composition (I) are shown below.

Polymer (A)

A-1: ω-hydroxy terminated polystyrene (Mw=10,900, Mw/Mn=1.09, CAS#9003-53-6, available from Polymer Source, a polymer represented by the following formula (A-1))

(A-1)

A-2: ω-hydroxy terminated polystyrene (Mw=21,300, Mw/Mn=1.09, CAS#9003-53-6, available from Polymer Source, a polymer represented by the following formula (A-2))

(A-2)

A-3: ω-hydroxy terminated polystyrene (Mw=35,200, Mw/Mn=1.10, CAS#9003-53-6, available from Polymer Source, a polymer represented by the following formula (A-3))

(A-3)

a-1: the polymer (a-1) synthesized in Synthesis Example 1

Solvent (B)

B-1: propylene glycol monomethyl ether acetate

B-2: cyclohexanone

Basic Compound

Q-1: triphenyl sulfonium n-butyltrifluoromethylsulfonamide (a compound represented by the following formula (Q-1))

(Q-1)

Preparation Example 1 (Preparation of Composition (S-1))

A composition (S-1) was prepared by mixing 100 parts by mass of the (A-1) as the polymer (A) and 9,900 parts by mass of (B-1) as the solvent (B).

Preparation Examples 2 to 8 (Preparation of Compositions (S-2) to (S-8))

Compositions (S-2) to (S-8) were prepared in similar manners to Preparation Example 1, except for using components of type and content specified in Table 1 below.

TABLE 1

| (parts by mass) | | Preparation Example 1 | Preparation Example 2 | Preparation Example 3 | Preparation Example 4 | Preparation Example 5 | Preparation Example 6 | Preparation Example 7 | Preparation Example 8 |
|---|---|---|---|---|---|---|---|---|---|
| Composition (I) | | S-1 | S-2 | S-3 | S-4 | S-5 | S-6 | S-7 | S-8 |
| Polymer (A) | A-1 | 100 | | | 50 | | 50 | 30 | 70 |
| | A-2 | | 100 | | 50 | 50 | | | |
| | A-3 | | | 100 | | 50 | 50 | 70 | 30 |
| Solvent (B) | B-1 | 9,900 | 9,900 | 9,900 | 9,900 | 9,900 | 9,900 | 9,900 | 9,900 |
| Solid content concentration (% by mass) | | 1 | 1 | 1 | 1 | 1 | 1 | 1 | 1 |

Preparation Example 9 (Preparation of Composition (CS-1))

A composition (CS-1) was prepared by mixing 100 parts by mass of the polymer (a-1), 8 parts by mass of (Q-1) as the basic compound, as well as 2,084 parts by mass of (B-1) and 894 parts by mass of (B-2) as the solvent (B).

Resist Pattern Formation

Examples 1 to 12

Base Pattern (Guide Hole Pattern) Formation

An underlayer film having an average thickness of 100 nm was formed on a bare-Si substrate by using a composition for underlayer film formation ("HM710" available from JSR Corporation). On this underlayer film, an SOG film having an average thickness of 30 nm was formed by using an SOG composition ("ISX302" available from JSR Corporation). On the SOG film, a resist composition ("AIM5484JN" available from JSR Corporation) was applied to form a resist film having an average thickness of 85 nm, which was then subjected to ArF liquid immersion lithography. The resist film was developed using a 2.38% by mass aqueous tetrabuthylammonium hydroxide solution to form a resist pattern. Next, by using this resist film pattern as a mask, etching of the SOG film was carried out with a gas mixture of $CF_4/O_2$/Air. Then, the underlayer film was etched by using thus obtained SOG film pattern as a mask with an $N_2/O_2$ gas mixture to form a circular hole pattern (hole diameter: 50 nm/pitch: 10 nm) (Examples 1 to 8) and an elliptic hole pattern (short axis length: 54 nm/short axis direction pitch: 176 nm; long axis length: 284 nm/long axis direction pitch: 350 nm) (Examples 9 to 12).

Resist Pattern Formation

The composition (I) shown in Table 2 or Table 3 below was spin-coated on the guide hole pattern thus formed, followed by baking at 200° C. for 20 min. The substrate obtained after the baking was rinsed by using propylene glycol monomethyl ether acetate (PGMEA) to obtain a resist pattern, which was a shrunk hole pattern.

Comparative Examples 1 and 2

Base Pattern (Guide Hole Pattern) Formation

An underlayer antireflective film having an average film thickness of 105 nm was formed on a Bare-Si substrate by using an antireflective film forming agent ("ARC66" available from Nissan Chemical Industries, Ltd.). A resist composition ("AIM5484JN" available from JSR) was applied onto the underlayer antireflective film to form a resist film having an average thickness of 70 nm, followed by ArF liquid immersion lithography, development with n-butyl acetate, and rinse with 4-methyl-2-pentanol, to form a circular hole pattern (hole diameter: 50 nm/pitch: 125 nm) (Comparative Example 1) and an elliptic hole pattern (short axis length: 55 nm/short axis direction pitch: 120 nm; long axis length: 120 nm/long axis direction pitch: 200 nm) (Comparative Example 2).

Resist Pattern Formation

The composition (CS-1) was spin-coated on the guide hole pattern thus formed, followed by baking at 120° C. for 60 sec. The substrate obtained after the baking was developed by using n-butyl acetate and then rinsed by using 4-methyl-2-pentanol to obtain a resist pattern, which was a shrunk hole pattern.

Evaluation

Circular Pattern (Examples 1 to 8 and Comparative Example 1)

The resist pattern thus formed (shrunk circular hole pattern) was evaluated for dimension reduction amount (unit: nm) and CDU (unit: nm) of the hole pattern, by using a scanning electron microscope. Results of the evaluation are shown in Table 2 below. CDU is defined by the standard deviation (±3σ) of a dimension of the hole pattern, and a smaller value indicates smaller variance in the hole pattern size, which is considered to be preferable.

TABLE 2

| | Composition (I) | Dimension reduction amount (nm) | CDU (nm) |
|---|---|---|---|
| Example 1 | S-1 | 11 | 2.3 |
| Example 2 | S-2 | 16 | 2.2 |
| Example 3 | S-3 | 20 | 2.3 |
| Example 4 | S-4 | 13 | 2.3 |
| Example 5 | S-5 | 18 | 2.5 |
| Example 6 | S-6 | 15 | 2.3 |
| Example 7 | S-7 | 18 | 2.4 |
| Example 8 | S-8 | 13 | 2.4 |
| Comparative Example 1 | CS-1 | 18 | 3.5 |

The results in Table 2 revealed that the pattern-forming methods of Examples can provide, in the case of the circular base pattern, a resist pattern with a small CDU and a superior directional uniformity of a dimension reduction amount in the shrinking.

Elliptic Pattern (Examples 9 to 12 and Comparative Example 2)

The resist pattern thus formed (shrunk elliptic hole pattern) was evaluated for the dimension reduction amount of the hole pattern and the dimension reduction amount ratio, by using a scanning electron microscope. Results of the evaluation are shown in Table 3 below. The dimension reduction amount is defined by an average value of a reduction amount in a short axis direction and a reduction amount in a long axis direction. The dimension reduction amount ratio is defined by a value obtained by dividing the reduction amount in the long axis direction with the reduction amount in the short axis direction, and a value closer to 1 is considered to be more preferable.

TABLE 3

|  | Composition (I) | Dimension reduction amount (nm) | Dimension reduction amount ratio (—) |
|---|---|---|---|
| Example 9 | S-1 | 10 | 1.00 |
| Example 10 | S-2 | 15 | 1.07 |
| Example 11 | S-5 | 19 | 1.18 |
| Example 12 | S-7 | 20 | 1.05 |
| Comparative Example 2 | CS-1 | 12 | 1.34 |

As can be seen from the results in Table 3, the pattern-forming methods of Examples can make, in the case of the elliptic base pattern, the dimension reduction amount ratio a value close to 1, indicating superior directional uniformity of the dimension reduction amount in the shrinking.

EXPLANATION OF THE REFERENCE SYMBOLS

1 Substrate
2 Base pattern
3 Composition (I)
4 Coating film (I)

What is claimed is:

1. A composition comprising a smaller molecular weight polymer and a larger molecular weight polymer, each having a different weight average molecular weight,
   wherein the smaller molecular weight polymer and the larger molecular weight polymer are each a styrene polymer having a group which bonds to at least one end of a main chain of the smaller molecular weight polymer and the larger molecular weight polymer and which comprises at least one group selected from the group consisting of a hydroxy group, a carboxy group, a sulfanyl group, an epoxy group, a cyano group, a vinyl group and a carbonyl group,
   a difference in weight average molecular weights between the smaller molecular weight polymer and the larger molecular weight polymer no less than 2,000.

2. The composition according to claim 1, wherein a weight average molecular weight of the smaller molecular weight polymer is no greater than 25,000, and a weight average molecular weight of the larger molecular weight polymer is greater than 25,000.

3. The composition according to claim 1, wherein a weight average molecular weight of the smaller molecular weight polymer is no less than 5,000 and no greater than 25,000, and a weight average molecular weight of the larger molecular weight polymer is greater than 25,000 and no greater than 50,000.

4. The composition according to claim 1, wherein the styrene polymer is an unsubstituted styrene homopolymer.

5. The composition according to claim 1, wherein a lower limit of a total content of the smaller molecular weight polymer and the larger molecular weight polymer in the composition with respect to a total solid content of the composition is 80% by mass.

6. The composition according to claim 1, wherein a lower limit of a total content of the smaller molecular weight polymer and the larger molecular weight polymer in the composition with respect to a total solid content of the composition is 90% by mass.

7. The composition according to claim 1, wherein a lower limit of a total content of the smaller molecular weight polymer and the larger molecular weight polymer in the composition with respect to a total solid content of the composition is 95% by mass.

8. The composition according to claim 1, further comprising a solvent.

9. The composition according to claim 8, wherein the solvent comprises a polyhydric alcohol partially etherified carboxylate solvent.

10. The composition according to claim 8, wherein the solvent comprises propylene glycol monomethyl ether acetate.

11. The composition according to claim 1, wherein the difference in weight average molecular weights between the smaller molecular weight polymer and the larger molecular weight polymer is no less than 5,000.

12. The composition according to claim 1, wherein the difference in weight average molecular weights between the smaller molecular weight polymer and the larger molecular weight polymer is no less than 8,000.

13. The composition according to claim 1, wherein the difference in weight average molecular weights between the smaller molecular weight polymer and the larger molecular weight polymer is no less than 15,000.

14. The composition according to claim 1, wherein the difference in weight average molecular weights between the smaller molecular weight polymer and the larger molecular weight polymer is no greater than 30,000.

* * * * *